(12) United States Patent
Okamoto

(10) Patent No.: US 9,839,137 B2
(45) Date of Patent: Dec. 5, 2017

(54) WIRED CIRCUIT BOARD AND PRODUCING METHOD THEREOF

(71) Applicant: NITTO DENKO CORPORATION, Osaka (JP)

(72) Inventor: Norihiko Okamoto, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 462 days.

(21) Appl. No.: 14/524,318

(22) Filed: Oct. 27, 2014

(65) Prior Publication Data

US 2015/0040379 A1 Feb. 12, 2015

Related U.S. Application Data

(62) Division of application No. 13/137,300, filed on Aug. 4, 2011, now Pat. No. 9,084,359.

(30) Foreign Application Priority Data

Sep. 6, 2010 (JP) .................................. 2010-198788

(51) Int. Cl.
*H05K 3/10* (2006.01)
*G11B 5/48* (2006.01)
*H05K 1/02* (2006.01)

(52) U.S. Cl.
CPC ............... *H05K 3/10* (2013.01); *G11B 5/486* (2013.01); *G11B 5/4833* (2013.01);
(Continued)

(58) Field of Classification Search
CPC ........ H05K 1/0269; H05K 3/28; H05K 3/225; H05K 13/00; H05K 3/10; Y10T 29/49004;
(Continued)

(56) References Cited

U.S. PATENT DOCUMENTS 3,658,518 A * 4/1972 Baltazzi ................ G03G 5/073
428/337
4,806,432 A * 2/1989 Eguchi .................. H05K 3/381
428/457
(Continued)

FOREIGN PATENT DOCUMENTS

CN 101806753 7/2013
JP 02-094594 A 4/1990
(Continued)

OTHER PUBLICATIONS

Office Action issued by the State Intellectual Property Office of China dated Feb. 3, 2015 in connection with Chinese Patent Application No. 201110267296.X.
(Continued)

*Primary Examiner* — A. Dexter Tugbang
*Assistant Examiner* — Kaying Kue
(74) *Attorney, Agent, or Firm* — Edwards Neils LLC; Jean C. Edwards, Esq.

(57) ABSTRACT

A method for producing a wired circuit board includes the steps of preparing a metal supporting layer; forming an insulating layer on the metal supporting layer; roughening the surface of the insulating layer; forming a conductive pattern on the insulating layer; and inspecting the presence or absence of a defect of the conductive pattern by using an inspection device provided with a light emitting portion emitting incident light that enters the insulating layer and the conductive pattern and a light receiving portion receiving reflected light that is reflected from the incident light. The incident light has a wavelength in the range of 435 to 500 nm and includes inclined light that inclines so as to form an angle of more than 0° to not more than 30° with respect to the optical axis thereof.

3 Claims, 7 Drawing Sheets

(52) U.S. Cl.
CPC ..... *H05K 1/0269* (2013.01); *H05K 2203/161* (2013.01); *Y10T 29/49004* (2015.01); *Y10T 29/49155* (2015.01)

(58) Field of Classification Search
CPC .. Y10T 29/49155; G11B 5/486; G11B 5/4833
See application file for complete search history.

(56) References Cited

U.S. PATENT DOCUMENTS

| | | | | |
|---|---|---|---|---|
| 5,278,012 | A | * | 1/1994 | Yamanaka ....... G01N 21/95684 250/559.44 |
| 6,014,209 | A | * | 1/2000 | Bishop ............... G01N 21/9501 356/237.5 |
| 6,084,664 | A | * | 7/2000 | Matsumoto ........... G01N 21/94 250/559.41 |
| 6,771,483 | B2 | | 8/2004 | Harada et al. |
| 7,142,405 | B2 | * | 11/2006 | Miyaji ................... B23Q 3/154 361/234 |
| 7,561,434 | B2 | * | 7/2009 | Nakamura .......... H01L 21/4846 257/784 |
| 2004/0237295 | A1 | * | 12/2004 | Wakizaka ............. H05K 3/389 29/830 |
| 2005/0005437 | A1 | * | 1/2005 | Nakamura ................ B32B 7/12 29/846 |
| 2009/0113704 | A1 | * | 5/2009 | Toyoda ................ G01N 21/956 29/850 |
| 2009/0114426 | A1 | * | 5/2009 | Tsunekawa ...... G01N 21/95684 174/250 |
| 2009/0238956 | A1 | | 9/2009 | Kojima |
| 2010/0208250 | A1 | * | 8/2010 | Ihara ...................... G01N 21/94 356/237.4 |
| 2012/0305049 | A1 | * | 12/2012 | Yuya ................ H01L 31/02242 136/244 |

FOREIGN PATENT DOCUMENTS

| | | |
|---|---|---|
| JP | 02-254380 A | 10/1990 |
| JP | 03-161992 A | 7/1991 |
| JP | 2001-304817 A | 10/2001 |
| JP | 2003-222510 A | 8/2003 |
| JP | 2004-128365 A | 4/2004 |
| JP | 2005-116745 A | 4/2005 |
| JP | 2007-288152 A | 11/2007 |
| JP | 2008-216059 A | 9/2008 |
| JP | 2009-291987 A | 12/2009 |
| JP | 2010-016244 A | 1/2010 |

OTHER PUBLICATIONS

Second Office Action issued by the State Intellectual Property Office (SIPO) of China dated Aug. 26, 2015 in connection with Chinese Patent Application No. 201110267296.X.
Notification of Reasons for Refusal issued by the Japanese Patent Office (JPO) dated Oct. 1, 2013 in Japanese Patent Application No. 2010-198788.

* cited by examiner

FIG. 2
(a)
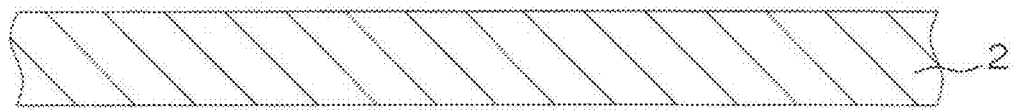
(b)
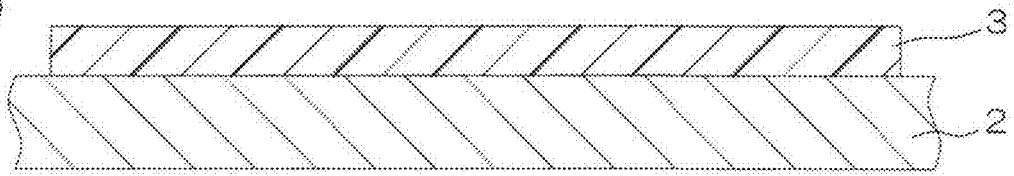
(c)
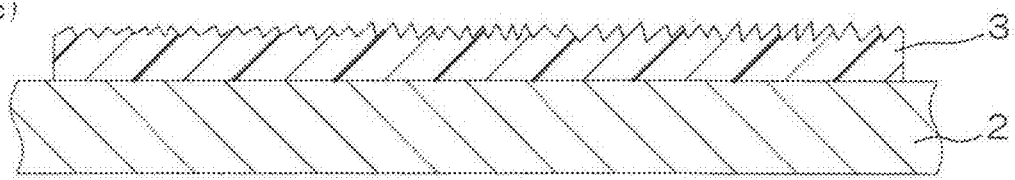
(d)
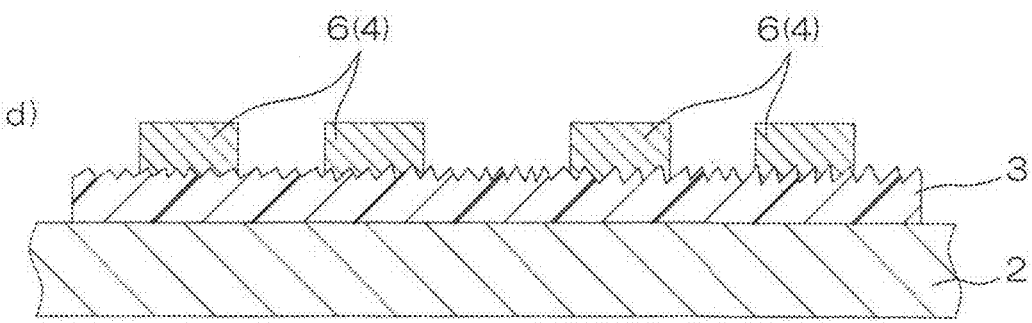
(e)
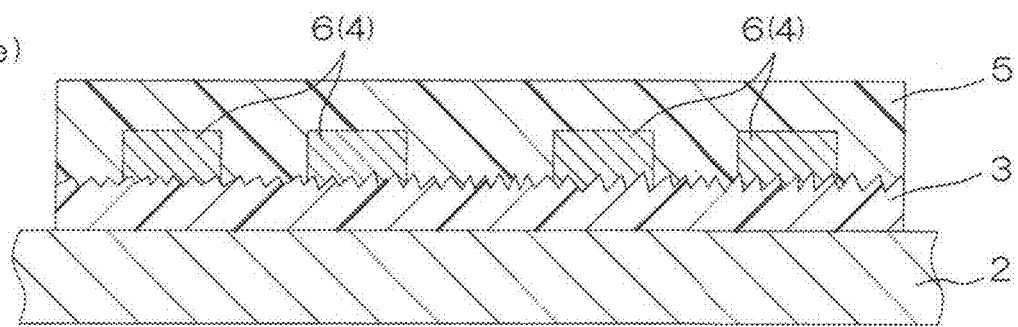

WIRED CIRCUIT BOARD AND PRODUCING METHOD THEREOF

CROSS-REFERENCE TO RELATED APPLICATION

The present application is a divisional patent application of U.S. patent application Ser. No. 13/137,300 filed Aug. 4, 2011, now U.S. Pat. No. 9,084,359, which issued Jul. 14, 2015, which claims priority from Japanese Patent Application No. 2010-198788, filed on Sep. 6, 2010, the contents of all of which are hereby incorporated by reference into this application in their entirety.

BACKGROUND OF THE INVENTION

Field of the Invention

The present invention relates to a producing method of a wired circuit board and a wired circuit board produced by the method.

Description of Related Art

Conventionally, a wired circuit board such as a suspension board with circuit has included a metal supporting layer, an insulating layer that is formed on the metal supporting layer, and a conductive pattern that is formed on the insulating layer. In the wired circuit board, when there is a defect in the conductive pattern, the connection reliability is reduced and therefore, the presence or absence of a defect of the conductive pattern has been inspected.

In the inspection, an AOI (automated optical inspection) device in which the presence or absence of a defect of the conductive pattern is judged by allowing inspection light to enter the conductive pattern to detect the inspection light that is reflected from the conductive pattern has been used.

For example, a producing method of a thin film multilayer board has been disclosed (ref: Japanese Unexamined Patent Publication No. H02-94594). In the method, laser light is applied to a thin film multilayer board having an insulating film and a wiring pattern that is formed on the insulating film with the laser light narrowed down by a condenser lens to detect reflected light, so that a defect and the like in the wiring pattern is judged.

In this method, the laser light having a wavelength of 450 nm or less is used so as to increase the difference of reflectance between the wiring pattern and the insulating film.

SUMMARY OF THE INVENTION

When the wired circuit board in which the metal supporting layer is provided under the insulating film is inspected by using the method described in the above-described Japanese Unexamined Patent Publication No. H02-94594, there may be a case where a part of incident light transmits through the insulating film to be reflected on the surface of the metal supporting layer, so that the reflected light on the metal supporting layer is detected together with the reflected light on the insulating film. That is, there may be a case where the intensity of the reflected light on the insulating film is detected strongly due to the effect of the reflected light on the metal supporting layer.

In this case, there is a disadvantage that the contrast between the wiring pattern and the insulating film is reduced, even though laser light having a specific wavelength with a large difference of reflectance between the wiring pattern and the insulating film is used.

When the contrast between the wiring pattern and the insulating film is reduced, the boundary between the wiring pattern and the insulating film becomes blurred, so that it becomes difficult to inspect the presence or absence of a defect of the conductive pattern accurately.

It is an object of the present invention to provide, in a wired circuit board provided with a metal supporting layer, a producing method of the wired circuit board in which the presence or absence of a defect of a conductive pattern can be inspected accurately and the wired circuit board.

The method for producing a wired circuit board of the present invention includes the steps of preparing a metal supporting layer; forming an insulating layer on the metal supporting layer; roughening the surface of the insulating layer; forming a conductive pattern on the insulating layer; and inspecting the presence or absence of a defect of the conductive pattern by using an inspection device provided with a light emitting portion emitting incident light that enters the insulating layer and the conductive pattern and a light receiving portion receiving reflected light that is reflected from the incident light; wherein the incident light has a wavelength in the range of 435 to 500 nm and includes inclined light that inclines so as to form an angle of more than 0° to not more than 30° with respect to the optical axis thereof.

In the method for producing the wired circuit board of the present invention, it is preferable that the surface of the insulating layer is roughened so that the arithmetic average roughness Ra (JIS B 0601-1994) of the surface is in the range of 0.15 to 1 μm.

In the method for producing the wired circuit board of the present invention, it is preferable that the transmittance of the incident light with respect to the insulating layer is 30% or less.

A wired circuit board of the present invention includes a metal supporting layer, an insulating layer that is formed on the metal supporting layer, and a conductive pattern that is formed on the insulating layer, wherein the arithmetic average roughness Ra (JIS B 0601-1994) of the surface of the insulating layer is in the range of 0.15 to 1 μm.

According to the wired circuit board obtained in the method for producing the wired circuit board of the present invention, the surface of the insulating layer is roughened. The incident light from the inspection device for inspecting the wired circuit board is adjusted to have the wavelength in the range of 435 to 500 nm.

Therefore, among the incident light that is emitted from the light emitting portion of the inspection device, the incident light that enters the insulating layer is reflected diffusely on the surface of the insulating layer. In addition, the incident light is adjusted to have the wavelength (435 to 500 nm) that is difficult to transmit through the insulating layer, so that it can be possible to suppress that the incident light transmits through the insulating layer to reach the surface of the metal supporting layer. Furthermore, even when a part of the incident light transmits through the insulating layer to be reflected on the surface of the metal supporting layer, the reflected light is reflected diffusely on the surface of the insulating layer.

In this way, the reflected light that is reflected on the surfaces of the insulating layer and the metal supporting layer is scattered by the diffuse reflection on the surface of the insulating layer, so that it becomes difficult that the reflected light is received in the light receiving portion. On the other hand, the reflected light that is reflected on the surface of the conductive pattern is received in the light receiving portion without being scattered.

Thus, the reflected light that is reflected on the surfaces of the insulating layer and the metal supporting layer is detected more weakly in the light receiving portion while the reflected light that is reflected on the surface of the conductive pattern is detected strongly in the light receiving portion.

As a result, the contrast between the conductive pattern and the insulating layer can be improved, so that the presence or absence of a defect of the conductive pattern can be inspected accurately even in the wired circuit board provided with the metal supporting layer.

Moreover, the incident light includes inclined light that inclines so as to form an angle of more than 0° to not more than 30° with respect to the optical axis thereof.

Therefore, the inclined light can be reflected on the side surface of the conductive pattern, so that the presence or absence of a defect of the conductive pattern can be inspected more accurately.

BRIEF DESCRIPTION OF THE DRAWINGS

FIG. 2 shows process drawings for describing production processes of the suspension board with circuit shown in FIG. 1:

(a) illustrating a step of preparing a metal supporting layer,
(b) illustrating a step of forming an insulating base layer,
(c) illustrating a step of roughening the surface of the insulating base layer,
(d) illustrating a step of forming a conductive pattern, and
(e) illustrating a step of forming an insulating cover layer.

Figure 3:
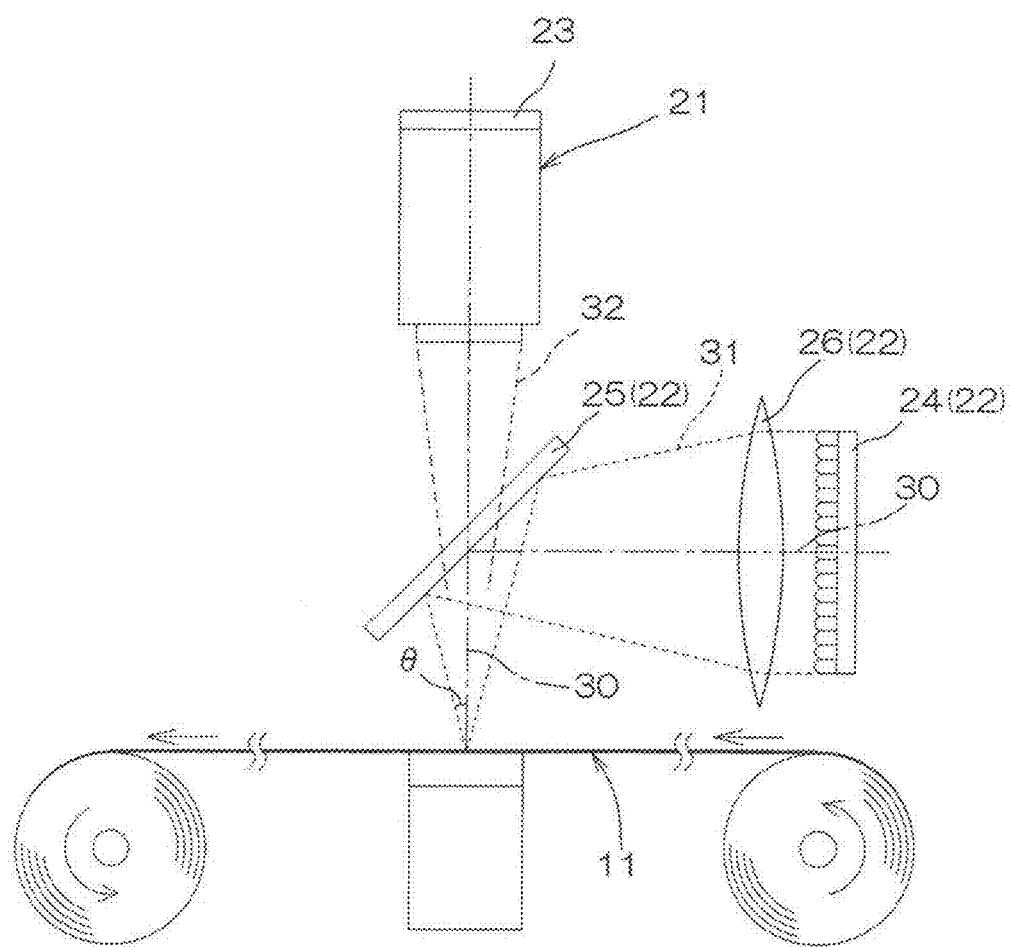

FIG. 3 shows an explanation drawing for describing a process of inspecting the presence or absence of a defect of the conductive pattern and a schematic configuration view of an inspection device.

Figure 4:
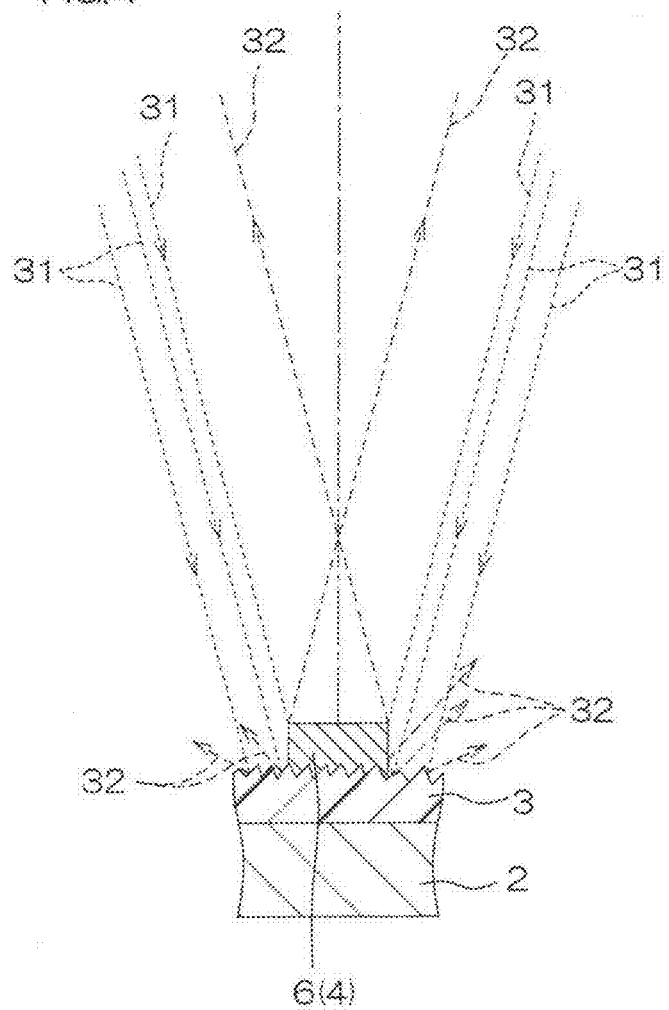

FIG. 4 shows an explanation drawing for describing a process of inspecting the presence or absence of a defect of the conductive pattern and an enlarged view of an essential part illustrating the conductive pattern that is inspected.

Figure 5:
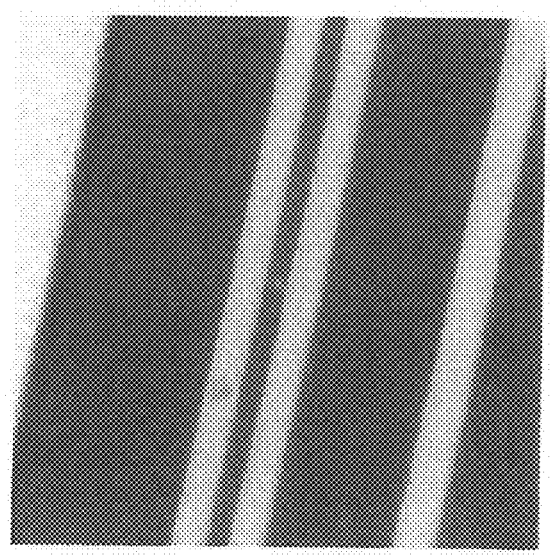

FIG. 5 shows an inspection image of the conductive pattern in Example.

Figure 6:
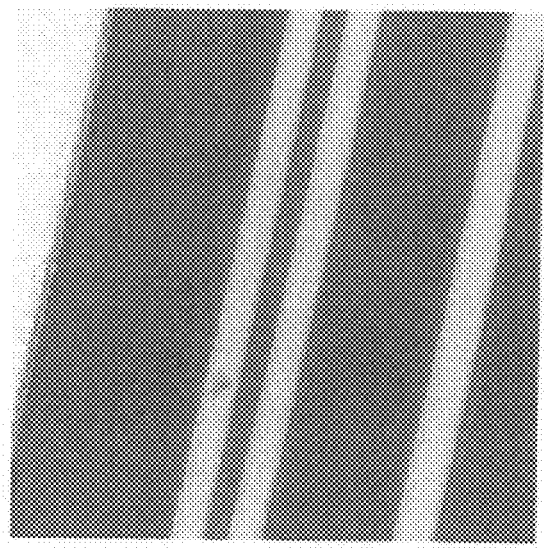

FIG. 6 shows an inspection image of the conductive pattern in Comparative Example 1.

Figure 7:
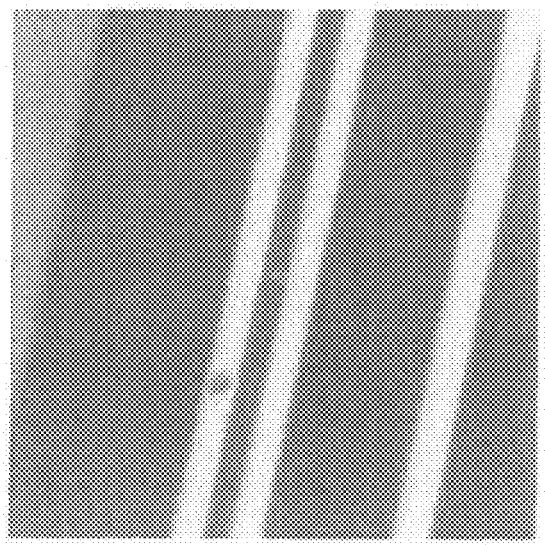

FIG. 7 shows an inspection image of the conductive pattern in Comparative Example 2.

Figure 8:
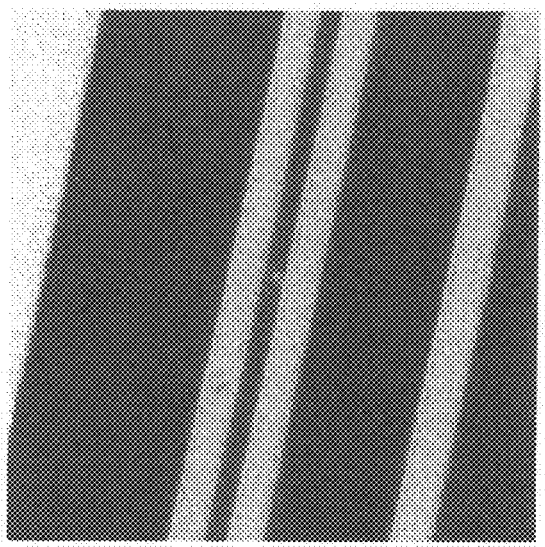

FIG. 8 shows an inspection image of the conductive pattern in Comparative Example 3.

Figure 9:
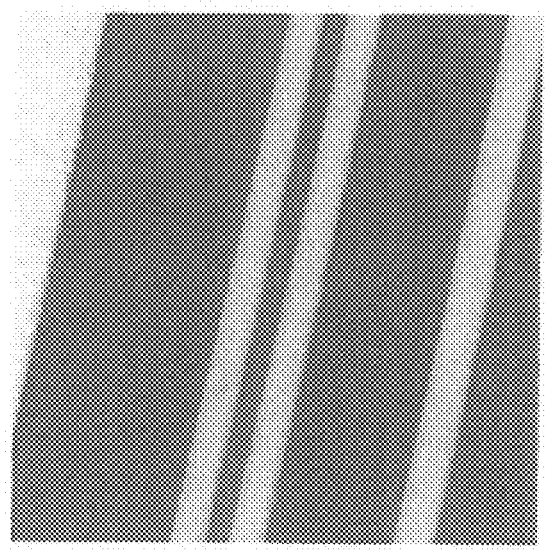

FIG. 9 shows an inspection image of the conductive pattern in Comparative Example 4.

DETAILED DESCRIPTION OF THE INVENTION

Figure 1:
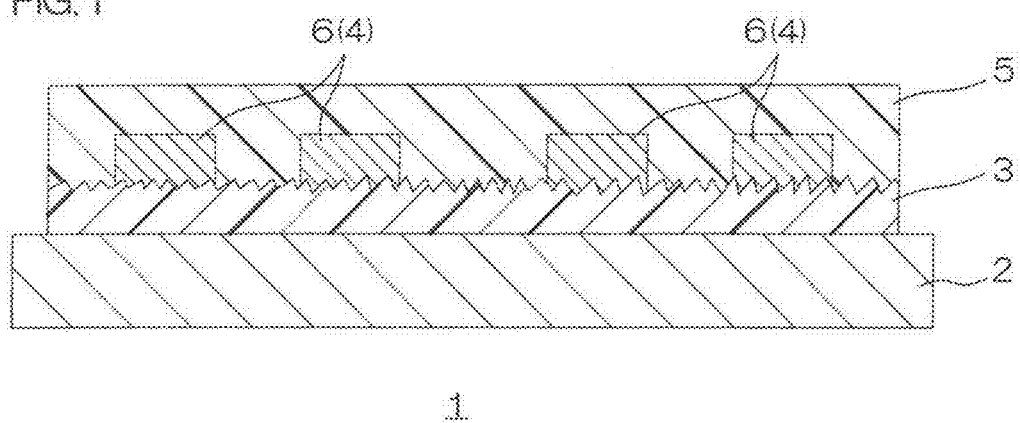
FIG. 1 shows a sectional view of a suspension board with circuit as one embodiment of a wired circuit board of the present invention.

FIG. 1 shows a sectional view of a suspension board with circuit as one embodiment of a wired circuit board of the present invention. In FIG. 1, the right-left direction of the paper surface is referred to as the widthwise direction of the suspension board with circuit, the up-down direction of the paper surface being referred to as the thickness direction of the suspension board with circuit, and the thickness direction of the paper being referred to as the lengthwise direction of the suspension board with circuit.

As shown in FIG. 1, a suspension board with circuit 1 includes a metal supporting layer 2, an insulating base layer 3 as one example of an insulating layer, a conductive pattern 4, and an insulating cover layer 5.

The metal supporting layer 2 is formed into a sheet shape.

The insulating base layer 3 is, on the metal supporting layer 2, formed into a predetermined shape in the portion where the conductive pattern 4 is formed.

The conductive pattern 4 is, on the insulating base layer 3, formed into a predetermined pattern. To be specific, the conductive pattern 4 includes a plurality (four pieces) of wires 6 that are arranged in parallel at spaced intervals to each other along the widthwise direction, each of head-side terminals (not shown) that is provided at one end portion of each of the wires 6 in the lengthwise direction, and each of external terminals (not shown) that is provided at the other end portion of each of the wires 6 in the lengthwise direction.

The insulating cover layer 5 is, on the insulating base layer 3, formed into a predetermined shape so as to cover each of the wires 6 and to expose each of the head-side terminals (not shown) and each of the external terminals (not shown).

FIG. 2 shows process drawings for describing production processes of the suspension board with circuit shown in FIG. 1. In FIG. 2, one suspension board with circuit 1 is shown. However, in the embodiment, a plurality of the suspension boards with circuits 1 are produced at the same time without being produced individually.

To be specific, a suspension board with circuit assembly sheet 11 integrally having a plurality of the suspension boards with circuits 1 is produced by patterning a plurality of the suspension boards with circuits 1 on the long metal supporting layer 2 so that a plurality of the suspension boards with circuits 1 are arranged in parallel at spaced intervals to each other. On mounting the suspension boards with circuits 1, for example, the suspension boards with circuits 1 are individually taken out from the suspension board with circuit assembly sheet 11 to be mounted.

To produce the suspension board with circuit 1, as shown in FIG. 2(a), the metal supporting layer 2 is first prepared.

The metal supporting layer 2 is formed from a metal material such as stainless steel, 42-alloy, aluminum, copper-beryllium, or phosphor bronze. Preferably, the metal supporting layer 2 is formed from stainless steel.

The metal supporting layer 2 has a thickness in the range of, for example, 10 to 50 μm, or preferably 15 to 35 μm.

Next, to produce the suspension board with circuit 1, as shown in FIG. 2(b), the insulating base layer 3 is formed on the surface of the metal supporting layer 2.

The insulating base layer 3 is formed from a synthetic resin such as polyimide, polyamide imide, acrylic, polyether nitrile, polyether sulfone, polyethylene terephthalate (PET), polyethylene naphthalate, and polyvinyl chloride. Preferably, the insulating base layer 3 is formed from polyimide from the viewpoint of thermal dimensional stability and the like.

To form the insulating base layer 3, for example, a solution of photosensitive synthetic resin is applied onto the surface of the metal supporting layer 2 and is then dried. Thereafter, the dried resin is exposed to light with a pattern in which the insulating base layer 3 is formed and is then developed to be heat cured as required.

Furthermore, the insulating base layer 3 can also be formed, for example, by preliminarily forming a synthetic resin into a film having the above-described pattern and adhesively bonding the film to the surface of the metal supporting layer 2 via a known adhesive layer.

The insulating base layer 3 has a thickness in the range of, for example, 3 to 20 μm, or preferably 3 to 10 μm.

The transmittance of the insulating base layer 3 is 30% or less in the wavelength of 500 nm or less and 30% or more in the wavelength of 550 nm or more.

The reflectance (incident angle of 5°) of the insulating base layer 3 with respect to the light in the wavelength of 435 to 500 nm is, for example, 20% or less, or preferably 15% or less.

Next, to produce the suspension board with circuit 1, as shown in FIG. 2(c), the surface of the insulating base layer 3 is roughened.

Examples of a method for roughing the surface of the insulating base layer 3 include a plasma treatment, a chemical etching treatment using an alkaline solution, a polishing treatment such as sandblasting, wet blasting, brush polishing, and buffing, and a concave-convex treatment such as embossing.

To be specific, the surface of the insulating base layer 3 is roughened so that the arithmetic average roughness Ra (JIS B 0601-1994) of the surface is in the range of, for example, 0.15 to 1 μm, or preferably 0.2 to 0.6 μm measured by surface observation using a laser microscope.

When the arithmetic average roughness Ra of the insulating base layer 3 is below the above-described range, it may be difficult to suppress the reflection of the incident light from an inspection device 21 to be described later on the surface of the insulating base layer 3. When the arithmetic average roughness Ra of the insulating base layer 3 is above the above-described range, the original function of the insulating base layer 3 may not be sufficiently obtained including a case where the conductive pattern 4 is formed distorted, or a case where the metal supporting layer 2 is partially exposed, resulting in a short circuit of the metal supporting layer 2 and the conductive pattern 4.

Next, to produce the suspension board with circuit 1, as shown in FIG. 2(d), the conductive pattern 4 is formed on the insulating base layer 3.

The conductive pattern 4 is formed from a conductive material such as copper, nickel, gold, solder, or alloys thereof. Preferably, the conductive pattern 4 is formed from copper from the viewpoint of reflection characteristics with respect to light.

To form the conductive pattern 4, a known patterning method such as an additive method or a subtractive method is used. Preferably, the additive method is used.

In the additive method, to be specific, a conductive seed film is first formed on the surface of the metal supporting layer 2 including the insulating base layer 3 by a sputtering method and the like. Next, a plating resist is formed on the surface of the conductive seed film in a pattern reverse to that of the conductive pattern 4. Thereafter, the conductive pattern 4 is formed on the surface of the conductive seed film of the insulating base layer 3 exposed from the plating resist by electrolytic plating. Subsequently, the plating resist and the conductive seed film on the portion where the plating resist is laminated are removed.

The specular gloss (incident angle of 45 degrees) of the conductive pattern 4 is in the range of, for example, 400 to 1200%, or preferably 600 to 1200% or more. When the specular gloss is within the above-described range, the intensity of reflected light 32 (described later) is improved, so that the obtained image of the conductive pattern 4 can be made much sharper.

The specular gloss can be measured with the incident angle of 45 degrees in conformity with "specular gloss measurement method" according to JIS Z 8741-1997. Such a specular gloss can be measured with a conventional gloss meter.

The reflectance (incident angle of 5°) of the conductive pattern 4 with respect to the light in the wavelength of 435 to 500 nm is, for example, 20% or more, or preferably 30% or more. The reflectance (incident angle of 5°) of the conductive pattern 4 with respect to the light in the wavelength of 550 to 850 nm is, for example, 75% or more, or preferably 85% or more. When the reflectance is within the above-described range, the intensity of the reflected light 32 (described later) is improved, so that the obtained image of the conductive pattern 4 can be made sharp.

Furthermore, the arithmetic average roughness Ra (JIS B 0601-1994) of the conductive pattern 4 is in the range of, for example, 0.02 to 0.15 μm, or preferably 0.02 to 0.1 μm.

When the arithmetic average roughness Ra of the conductive pattern 4 is within the above-described range, the intensity of the reflected light 32 (described later) is improved, so that the obtained image of the conductive pattern 4 can be made sharp.

The thickness of the conductive pattern 4 is in the range of, for example, 3 to 30 μm, or preferably 5 to 20 μm. The width of each of the wires 6 may be the same or different from each other and is in the range of, for example, 5 to 500 μm, or preferably 10 to 200 μm. The spacing between each of the wires 6 may be the same or different from each other and is in the range of, for example, 5 to 200 μm, or preferably 5 to 100 μm.

Next, to produce the suspension board with circuit 1, the presence or absence of a defect of the conductive pattern 4 is inspected.

To inspect the presence or absence of a defect of the conductive pattern 4, as shown in FIGS. 3 and 4, the inspection device 21 is used.

The inspection device 21 is an AOI device for inspecting the presence or absence of a defect of the conductive pattern 4 of the suspension board with circuit 1. The inspection device 21 is configured so that an optical axis 30 of incident light 31 for entering the suspension board with circuit 1 and the optical axis 30 of the reflected light 32 from the suspension board with circuit 1 are the same axis, and a detecting method of a so-called coaxial illumination is used thereto.

The inspection device 21 is provided with a light source unit 22 as a light emitting portion and a camera unit 23 as a light receiving portion.

The light source unit 22 is arranged in spaced relation to the surface of the suspension board with circuit 1 and is provided with a light source 24, a half mirror 25, and a light focusing member 26.

The light source 24 emits the incident light 31 and includes, for example, a LED (light emitting diode), fluorescent light, incandescent light, halogen light, and the like. Preferably, the light source 24 includes a LED from the viewpoint of the wavelength of the incident light 31. More preferably, the light source 24 includes a plurality of the LEDs that are arranged in alignment.

The wavelength of the incident light 31 emitted from the light source 24 is in the range of, for example, 435 to 500 nm, or preferably 435 to 485 nm. When the wavelength of the incident light 31 is within the above-described range, it is possible to suppress that the incident light 31 transmits through the insulating base layer 3 to reach the surface of the metal supporting layer 2, so that the reflection of the incident light 31 on the metal supporting layer 2 can be suppressed.

The half mirror 25 is made of a known half mirror and is spaced in opposed relation to the light source 24. In addition, the half mirror 25 is inclined so as to form an angle of about 45° with respect to the optical axis 30 of the incident light 31 from the light source 24 so that the incident light 31 from the light source 24 is reflected in a direction generally perpendicular to the incident direction thereof.

The light focusing member 26 is made of, for example, an optical lens and is disposed between the light source 24 and the half mirror 25. The light focusing member 26 focuses the incident light 31 from the light source 24 as the incident light 31 goes toward the half mirror 25.

In this way, the inclined light that inclines toward the optical axis 30 so as to be directed to the focal point of the light focusing member 26 is included in the incident light 31 that is focused by the light focusing member 26. Furthermore, the half mirror 25 reflects the incident light 31 that includes the inclined light, so that the inclined light is also included in the incident light 31 that is reflected by the half mirror 25.

The light focusing member 26 focuses the incident light 31 so that the incident light 31 includes the inclined light that forms an angle θ of, for example, more than 0° to not more than 30° with respect to the optical axis 30.

When the inclined light is not included in the incident light (that is, the light along the optical axis 30 (the light that has the angle θ of 0° with respect to the optical axis 30) only), it is difficult to obtain a sharp image.

When the angle θ between the optical axis 30 of the incident light 31 and the inclined light is above the above-described range, it is difficult to suppress the reflection of the incident light 31 on the surface of the insulating base layer 3.

The light source unit 22 is provided so that the incident light 31 that is reflected by the half mirror 25 enters along the thickness direction of the suspension board with circuit 1 (so that the optical axis 30 of the incident light 31 is along the thickness direction of the suspension board with circuit 1).

The camera unit 23 is spaced in opposed relation to the half mirror 25 of the light source unit 22 on the opposite side of the suspension board with circuit 1. The camera unit 23 is provided with a camera such as a near-infrared camera, a CCD camera, and the like. Preferably, the camera unit 23 is provided with a CCD camera from the viewpoint of versatility.

For the inspection by using the inspection device 21, the suspension board with circuit assembly sheet 11 is conveyed so that the incident light 31 is applied to the conductive pattern 4 of the suspension board with circuit 1 that is the test object.

Then, among the incident light 31, the incident light 31 that enters each of the wires 6 is reflected on the surfaces of each of the wires 6. The reflected light 32 that is reflected on the surfaces of each of the wires 6 is transmitted through the half mirror 25 to be received in the camera unit 23.

On the other hand, among the incident light 31, the incident light 31 that enters the insulating base layer 3 is scattered on the surface of the insulating base layer 3. The reflected light 32 that transmits through the insulating base layer 3 to be reflected on the surface of the metal supporting layer 2 is scattered on the surface of the insulating base layer 3.

That is, among the reflected light 32 that is reflected on the surfaces of the insulating base layer 3 and the metal supporting layer 2, a small amount of the reflected light 32 that is reflected toward the camera unit 23 is received in the camera unit 23.

In this way, when the conductive pattern 4 of the suspension board with circuit 1 is photographed with the camera unit 23, the reflected light 32 that is reflected on the surfaces of the insulating base layer 3 and the metal supporting layer 2 is photographed more darkly while the reflected light 32 that is reflected on the surfaces of each of the wires 6 is photographed brightly.

In an image that is photographed with the camera unit 23, when a defective portion and/or a short-circuited portion of the conductive pattern 4 are/is detected, the shape of the conductive pattern 4 is judged to be defective. When a defective portion and a short-circuited portion of the conductive pattern 4 are not detected, the shape of the conductive pattern 4 is judged to be non-defective.

Next, to produce the suspension board with circuit 1, as shown in FIG. 2(e), the insulating cover layer 5 is formed on the insulating base layer 3 so as to cover the conductive pattern 4.

An insulating material for forming the insulating cover layer 5 includes the same insulating material as that for forming the above-described insulating base layer 3. Preferably, polyimide is used from the viewpoint of transmission characteristics with respect to light.

The insulating cover layer 5 is formed into a pattern where the insulating cover layer 5 covers the wires 6 and exposes the terminal portions on the surface of the insulating base layer 3. The thickness of the insulating cover layer 5 is in the range of, for example, 1 to 30 μm, or preferably 2 to 20 μm.

The suspension board with circuit 1 is obtained in this manner.

According to the suspension board with circuit 1 produced by the method for producing the suspension board with circuit 1, as shown in FIGS. 3 and 4, the surface of the insulating base layer 3 is roughened. The incident light 31 from the inspection device 21 for inspecting the suspension board with circuit 1 is adjusted to have the wavelength in the range of 435 to 500 nm.

Therefore, among the incident light 31, the incident light 31 that enters the insulating base layer 3 is reflected diffusely on the surface of the insulating base layer 3. In addition, the incident light 31 is adjusted to have the wavelength (435 to 500 nm) that is difficult to transmit through the insulating base layer 3, so that it can be possible to suppress that the incident light 31 transmits through the insulating base layer 3 to reach the surface of the metal supporting layer 2. Furthermore, even when a part of the incident light 31 transmits through the insulating base layer 3 to be reflected on the surface of the metal supporting layer 2, the reflected light 32 is reflected diffusely on the surface of the insulating base layer 3.

In this way, the reflected light 32 that is reflected on the surfaces of the insulating base layer 3 and the metal supporting layer 2 is scattered by the diffuse reflection on the surface of the insulating base layer 3, so that it becomes difficult that the reflected light 32 is received in the camera unit 23. On the other hand, the reflected light 32 that is reflected on the surface of the conductive pattern 4 is received in the camera unit 23 without being scattered.

Therefore, the reflected light 32 that is reflected on the surfaces of the insulating base layer 3 and the metal supporting layer 2 is photographed more darkly in the camera unit 23 while the reflected light 32 that is reflected on the surface of the conductive pattern 4 is photographed brightly in the camera unit 23.

As a result, the contrast between the conductive pattern 4 and the insulating base layer 3 can be improved, so that the presence or absence of a defect of the conductive pattern 4 can be inspected accurately even in the suspension board with circuit 1 provided with the metal supporting layer 2.

Moreover, the incident light 31 includes the inclined light that inclines so as to form the angle θ of more than 0° to not more than 30° with respect to the optical axis 30 thereof.

Therefore, the inclined light can be reflected on the side surface of the conductive pattern 4, so that the presence or absence of a defect of the conductive pattern 4 can be inspected more accurately.

According to the method for producing the suspension board with circuit 1, the surface of the insulating base layer 3 is roughened so that the arithmetic average roughness Ra (JIS B 0601-1994) of the surface is in the range of 0.15 to 1 μm.

Therefore, the incident light 31 that enters the insulating base layer 3 and the reflected light 32 that is reflected on the metal supporting layer 2 can be efficiently scattered, so that the contrast between the conductive pattern 4 and the insulating base layer 3 can be further improved.

According to the method for producing the suspension board with circuit 1, the transmittance of the incident light 31 with respect to the insulating base layer 3 is 30% or less.

Therefore, it is possible to further suppress that the incident light 31 transmits through the insulating base layer 3 to reach the surface of the metal supporting layer 2.

In the above-described embodiment, the insulating base layer 3 is roughened before the conductive pattern 4 is formed. Alternatively, the insulating base layer 3 other than the portion where the conductive pattern 4 is formed can be roughened after the conductive pattern 4 is formed.

EXAMPLE

While the present invention will be described hereinafter in further detail with reference to Examples and Comparative Examples, the present invention is not limited to these Examples and Comparative Examples.

Example 1

First, a metal supporting layer made of stainless steel having a thickness of 25 μm was prepared (ref: FIG. 2(*a*)). Next, a varnish of a photosensitive polyamic acid resin was applied to the surface of the metal supporting layer and was then dried. Thereafter, the dried varnish was exposed to light and was then developed to be heat cured, so that an insulating base layer made of polyimide having a thickness of 5 μm was formed into the above-described pattern (ref: FIG. 2(*b*)).

The transmittance of the insulating base layer was 14% in the wavelength of 450 nm and 45% in the wavelength of 620 nm.

Next, the surface of the insulating base layer was subjected to a roughening process by sandblasting (ref: FIG. 2(*c*)). The arithmetic average roughness Ra (JIS B 0601-1994) of the insulating base layer after the roughening process was 0.3 μm.

Next, as a conductive thin film, a chromium thin film having a thickness of 0.03 μm and a copper thin film having a thickness of 0.07 μm were successively formed on the surface of the insulating base layer including the metal supporting layer by chromium sputtering and copper sputtering. Subsequently, a plating resist in a pattern reverse to that of the conductive pattern was formed on the surface of the conductive thin film. Then, the conductive pattern having a thickness of 10 μm was formed on the surface of the conductive thin film exposed from the plating resist by electrolytic copper plating. Thereafter, the plating resist and the conductive thin film on the portion where the plating resist was formed were removed by chemical etching (ref: FIG. 2(*d*)).

The specular gloss of the conductive pattern was 800%.

The reflectance (incident angle of 5°) of the conductive pattern was 45% in the wavelength of 450 nm and 90% in the wavelength of 620 nm.

The arithmetic average roughness Ra (JIS B 0601-1994) of the conductive pattern was 0.06 μm.

Next, by using the above-described inspection device, the incident light having the wavelength of 450 nm was applied to the conductive pattern and the insulating base layer with being focused so as to include the inclined light that formed an angle of more than 0° to not more than 30° with respect to the optical axis thereof. Then, the reflected light was received with a CCD camera, thereby obtaining an inspection image (ref: FIG. 5). The presence or absence of a defect of the conductive pattern was inspected by analyzing the obtained inspection image. In addition, the obtained image quality of the inspection image was evaluated. The result is shown in the following Table 1.

Next, a varnish of a photosensitive polyamic acid resin was applied to the surface of the insulating base layer including the conductive pattern and was then dried. Thereafter, the dried varnish was exposed to light and was then developed to be heat cured, so that an insulating cover layer made of polyimide having a thickness of 5 μm was formed with a pattern of covering the wires and exposing the head-side terminals and the external terminals (ref: FIG. 2(*e*)).

A suspension board with circuit was obtained in this manner.

Comparative Example 1

A suspension board with circuit was obtained in the same manner as in Example 1 by inspecting the presence or absence of a defect of the conductive pattern except that the insulating base layer was not subjected to a roughening process. The obtained image quality of the inspection image (ref: FIG. 6) is shown in the following Table 1.

Comparative Example 2

A suspension board with circuit was obtained in the same manner as in Example 1 by inspecting the presence or absence of a defect of the conductive pattern except that the wavelength of the incident light was changed to 620 nm. The obtained image quality of the inspection image (ref: FIG. 7) is shown in the following Table 1.

Comparative Example 3

A suspension board with circuit was obtained in the same manner as in Example 1 by inspecting the presence or absence of a defect of the conductive pattern except that the incident light was applied so as not to include the inclined light (that is, the light along the optical axis only). The obtained image quality of the inspection image (ref: FIG. 8) is shown in the following Table 1.

Comparative Example 4

A suspension board with circuit was obtained in the same manner as in Example 1 by inspecting the presence or absence of a defect of the conductive pattern except that the incident light was applied with being focused so as to include the inclined light that formed an angle of more than 0° to not more than 50° with respect to the optical axis thereof. The obtained image quality of the inspection image (ref: FIG. 9) is shown in the following Table 1.

TABLE 1

|  |  | Example 1 | Comparative Example 1 | Comparative Example 2 | Comparative Example 3 | Comparative Example 4 |
| --- | --- | --- | --- | --- | --- | --- |
| Roughening Process | | Present | Absent | Present | Present | Present |
| Incident Light | Wavelength (nm) | 450 | 450 | 620 | 450 | 450 |
| | Angle θ (°) | 0 to 30 | 0 to 30 | 0 to 30 | 0 | 0 to 50 |
| Image Quality | Conductive Pattern | Good | Poor | Bad | Poor | Bad |
| | Defective Portion | Good | Bad | Bad | Poor | Poor |

<Evaluation Criteria of Image Quality>

The inspection images (ref: FIGS. 5 to 9) obtained in Example and each of Comparative Examples were observed to evaluate whether the conductive pattern and the defective portion were photographed sharply or not.

Good: The conductive pattern or the defective portion was sharp.

Poor: The conductive pattern or the defective portion was slightly blurred.

Bad: the conductive pattern or the defective portion was blurred and difficult to be recognized.

In the inspection image (ref: FIG. 5) obtained in Example, the contrast between the conductive pattern and the insulating base layer was improved, so that the conductive pattern and the defective portion could be photographed sharply.

In the inspection images (ref: FIGS. 6, 7, and 9) obtained in Comparative Examples 1, 2, and 4, the entire images became whitely cloudy and it was difficult to obtain the contrast between the conductive pattern and the insulating base layer, so that it was difficult to photograph the conductive pattern sharply.

In the inspection image (ref: FIG. 8) obtained in Comparative Example 3, the contrast between the conductive pattern and the insulating base layer was obtained. However, it was difficult to photograph the defective portion sharply.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a wired circuit board comprising the steps of:
   preparing a metal supporting layer;
   forming an insulating layer on the metal supporting layer;
   roughening the surface of the insulating layer;
   forming a conductive pattern on the insulating layer that has been roughened; and
   inspecting the presence or absence of a defect of the conductive pattern by using an
   inspection device provided with a light emitting portion emitting incident light that enters the insulating layer and the conductive pattern and a light receiving portion receiving reflected light that is reflected from the incident light,
   wherein the incident light has a wavelength in the range of 435 to 500 nm and includes inclined light that inclines so as to form an angle of more than 0° to not more than 30° with respect to an optical axis of the incident light.

2. The method for producing the wired circuit board according to claim 1, wherein the surface of the insulating layer is roughened so that the arithmetic average roughness Ra (JIS B 0601-1994) of the surface is in the range of 0.15 to 1 µm.

3. The method for producing the wired circuit board according to claim 1, wherein a transmittance of the incident light with respect to the insulating layer is 30% or less.

* * * * *